Oct. 18, 1960 L. H. ENLOE 2,957,143

WIDEBAND TRANSISTOR AMPLIFIER

Filed Sept. 11, 1959 2 Sheets-Sheet 1

INVENTOR

LOUIS H. ENLOE

BY Cushman, Darby & Cushman

ATTORNEYS

Oct. 18, 1960 L. H. ENLOE 2,957,143

WIDEBAND TRANSISTOR AMPLIFIER

Filed Sept. 11, 1959 2 Sheets-Sheet 2

INVENTOR
LOUIS H. ENLOE

BY Cushman, Darby & Cushman
ATTORNEYS

United States Patent Office 2,957,143

Patented Oct. 18, 1960

2,957,143

WIDEBAND TRANSISTOR AMPLIFIER

Louis H. Enloe, Holmdel, N.J., assignor to Arizona Research Foundation, Tucson, Ariz., a corporation of Arizona Filed Sept. 11, 1959, Ser. No. 839,379

8 Claims. (Cl. 330—30)

This invention relates to wideband amplifiers employing transistors as the amplifying elements, and in particular to a transistorized distributed amplifier.

The conventional techniques of wideband amplifier design have been explored thoroughly in recent years. They have shown that there is an upper limit to the gain-bandwidth product associated with a given vacuum tube or transistor type, regardless of the complexity of the interstage coupling networks. The limit is governed primarily by shunt capacities, associated with the respective active device, across which a voltage must be developed. This places a definite limit on the bandwidth obtainable by cascading single stage amplifiers, for if the desired overall bandwidth is greater than the gain-bandwidth product of the individual stages, each stage attenuates instead of amplifying.

The vacuum tube distributed amplifier can be used to obtain amplification over bandwidths in excess of the gain-bandwidth product of its vacuum tube amplifying sections. The individual sections are connected together in such a manner that their input and output capacities form part of an artificial transmission line. Each section amplifies the voltage wave propagating down the input line. The sections are arranged so that the amplified voltages are added in phase on the output transmission line. Since the voltages are combined by addition, the total amplification is equal to the sum of the section gains rather than the product. Amplification is then possible even though the gains of the individual sections are less than unity.

Although it might be expected that transistors could be directly substituted for the vacuum tubes in a conventional distributed amplifier, it has been found that this cannot be the case with desirable results. For wideband distributed amplifiers the natural tendency would be to utilize the grounded or common base transistor configuration because of its high cutoff frequency. However, the low input impedance of such a configuration places severe limitations on the impedance level of the input line. A somewhat higher input impedance can be obtained in the grounded or common emitter circuit, but the bandwidth of this configuration is greatly reduced. It has been suggested that the bandwidth thereof can be increased at the expense of gain, by a parallel resistance-capacitor (RC) circuit connected in series with the emitter electrode for emitter degeneration purposes. If the collector barrier capacitive reactance is large compared to the load resistance, the voltage gain contains one zero and two poles in the finite $s$-plane. There is then not only an increase in bandwidth at the expense of gain, but also an increase in impedance. However, the gain-bandwidth product is not independent of the internal and external emitter resistance. After considerable work on this problem, I discovered that a transistor, when connected in the common emitter configuration, may be made to have substantially a reactive behavior if the time constant of the external emitter RC circuit is substantially equal to the reciprocal of the angular frequency of the transistor when the current gain thereof in a common emitter configuration substantially equals one. Under such conditions, the gain-bandwidth product is fully independent of the internal and external emitter resistance so that gain may be exchanged for bandwidth by adjusting the external emitter resistance.

The addition of the external emitter resistance when properly proportioned in value makes the total effective emitter resistance (external plus internal resistance times the common emitter, low frequency, short circuit current gain factor) so large compared to the impedance level of any wideband interstage as to be neglectable, while the externally added emitter capacitance in conjunction with the internal associated capacitance reduces the effective input capacity from, say, 50 $\mu\mu$f. down to, say, 0.7 $\mu\mu$f. Under such conditions, the input circuit looks like a pure capacitance, but in reality, there is an unavoidable so-called "base spreading" resistance in series therewith when a connection is made to the base electrode, due to the present day inability to make that connection non-resistive. It is because of that resistance that one cannot actually place any component directly across the input capacitance, as one can the internal input capacitance of a vacuum tube. However, by adding the parallel RC emitter circuit as above-described, the series spreading resistance combines with the effective input capacity to produce an input conductance which increases with the square of frequency in the same manner as that of a vacuum tube at high frequencies, the transistor input impedance raises considerably, and the gain is exchanged for bandwidth without decreasing the gain-bandwidth product, i.e., that product remains approximately constant, thereby greatly increasing the bandwidth over that provided for by transistorized prior art circuits. A plurality of such wideband transistor amplifiers may be employed as the amplifying elements with constant-K transmission lines in a distributed amplifier.

It is, therefore, one object of this invention to provide in a wideband amplifier at least one transistor situated in a common emitter configuration with a parallel RC circuit serially connected to its emitter electrode, the time constant of the RC circuit being substantially equal to the reciprocal of the angular frequency of the transistor when the common emitter configuration current gain of that transistor is substantially equal to one.

It is another object of this invention to employ the transistor circuit of the foregoing object in a distributed amplifier of the constant-K type.

Constant-K type non-transistorized distributed amplifiers are well-known. However, following my discovery of the above-mentioned wideband amplifier and its unique incorporation into a constant-K distributed amplifier, I discovered a constant resistance distributed amplifier after realizing that the base spreading or lead contact resistance in the input circuit of transistors in the common emitter configuration could be employed to advantage by its corporation into a filter section. The resulting substantially lossless network or filter section has a characteristic constant impedance which is resistive rather than complex, and consequently is terminated in a resistance without any intervening matching network. In addition, I discovered that a constant resistance filter section could be made for each transistor output so as to form a constant resistance output transmission line for a distributed amplifier.

It is, therefore, another object of this invention to provide a distributed amplifier with transistorized wideband amplifiers, as aforementioned, with the input and output transmission lines having a characteristic impedance which is a constant resistance.

Still other objects of this invention will become apparent to those of ordinary skill in the art by reference to the following detailed description of the exemplary embodiments of the apparatus and the appended claims. The various features of the exemplary embodiments according to the invention may be best understood with reference to the accompanying drawings, wherein:

Figure 1:
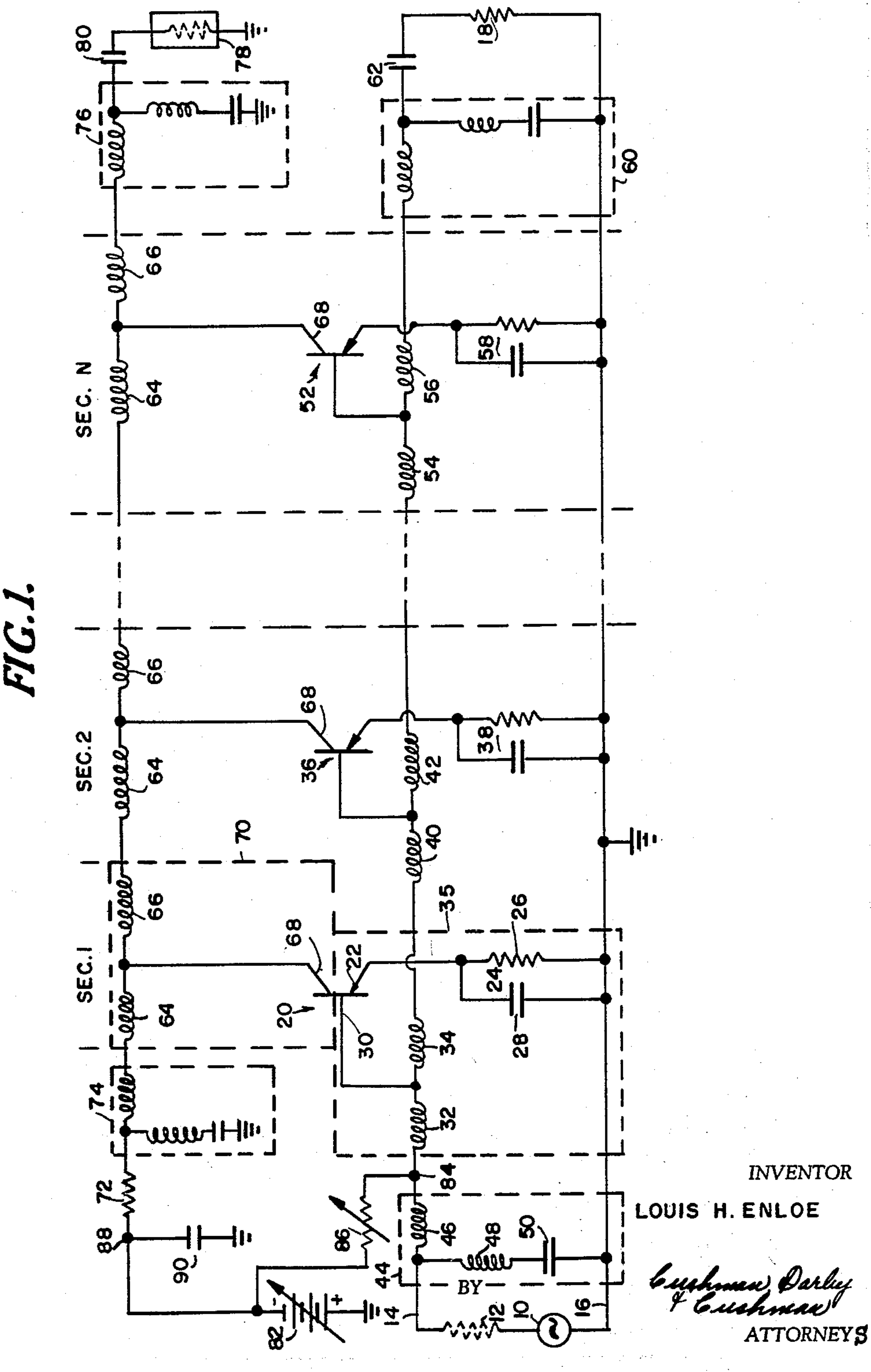
Figure 1 is a schematic drawing of a constant-K transistorized distributed amplifier.

In Figure 1 there is illustrated a distributed amplifier with N stages or sections as designated. The signal to be amplified is shown as having a source 10 whose internal impedance is illustrated by the dotted resistor 12. This signal is applied across an input artificial transmission line comprising two conductors 14 and 16, the latter of which is shown grounded. The remote end of the input transmission line is terminated in its characteristic impedance, for example by resistor 18, which has a value the same as the internal impedance 12 of source 10.

The first amplification stage of the amplifier includes transistor 20 which, as will be recognized, is connected in a grounded or common emitter configuration. The emitter electrode 22 is coupled to the input transmission ground line 16 by a parallel resistance-capacitance (RC) circuit 24 comprising resistor 26 and condenser 28, while the base electrode 30 is connected by the two inductances 32, 34 which are serially connected in conductor 14 of the input transmission line. The internal impedance of the base-emitter input circuit, including externally only the RC circuit 24, is effectively a series resistance shunted by a condenser. This, when combined with inductances 32, 34, effectively provides a T-type constant-K filter section within dash line 35 in the input transmission line.

Section 2 of the amplifier similarly includes a like type transistor, designated 36, whose emitter electrode is coupled through an RC circuit 38 to ground line 16, and whose base electrode is connected between the inductances 40 and 42. In a manner like that above explained, the base-emitter internal and external impedance comprises another constant-K type filter for the input transmission line. The values for the inductances 32, 34, 40 and 42 are equal, and the input and output characteristic impedance of each of the filter sections of the input transmission line are all equal, thereby providing proper impedance matching between adjacent sections.

For matching the impedances of the internal resistance 12 to the input impedance of filter section 35, there is inserted therebetween, a series *m*-derived half section filter 44. This filter includes series inductance 46, parallel inductance 48, and condenser 50, the values of all of which may be derived in conventional manner.

Any number of stages or sections may be employed in the distributed amplifier with the output characteristic impedance of each sectional filter section being matched to the input characteristic impedance of the next sectional filter of the input transmission line. The Nth section of the amplifier of Figure 1 is exactly like each of the heretofore described sections, and includes transistor 52 with base connected inductances 54, 56 and an emitter parallel RC circuit 58. The output of section N is matched to the characteristic line impedance as represented by resistor 18 by another half section series *m*-derived filter 60, with coupling and direct current blocking between this filter and resistor 18 being by condenser 62.

Those skilled in the art will recognize that each of the sectional input filters is of the low pass type. The distributed amplifier of Figure 1, therefore, has a low pass input transmission line.

Each output stage or section of the amplifier of Figure 1 includes two serially connected inductances 64, 66 with the junction therebetween being coupled to the respective collector electrode 68. Since the effective output impedance of the transistor is capacitative, each output or collector line filter, for example that within dash line 70, is effectively a T-type constant-K filter section. At the end remote from the termination of the input transmission line, i.e. at the left end of Figure 1, the output transmission line is terminated in its characteristic impedance by resistor 72. This resistance is matched to the input impedance of the filter 70 by a half section series *m*-derived filter 74. At the output transmission line, another half section series *m*-derived filter 76 is employed between the terminating load 78 and the Nth section of the amplifier, the load being coupled to filter 76 by a direct current blocking condenser 80. The characteristic impedance of load 78 is equal in value to the resistance value of resistor 72, and to the input-output impedance characteristic of each of the sectional collector line filters.

For purposes of providing operational voltage and current for the transistors, a battery 82 is employed in Figure 1. The positive terminal of this battery is grounded, while its negative terminal is coupled to the base line at junction 84 through a resistance 86 which, as shown, may be variable to give the recommended base current for the particular transistors employed. The negative terminal of battery 82 is also connected to the collector line at junction 88 between the resistor 72 and bypass condenser 90. Resistor 72, therefore, acts not only as a terminating resistor but also as collector feed resistance. Battery 82 may be adjusted to supply the proper collector-emitter voltage and current.

Using Philco 2N502 transistors, a five section constant-K distributed amplifier like that in Figure 1 was found to have a 3 db bandwidth of 235 megacycles and a power gain of 10.7 db with the saturated power output being 61 milliwatts, when the following values were employed.

| | | |
|---|---|---|
| Resistors **12** and **18**, each | ohms | 250 |
| Resistor **26** and homologues, each | do | 307 |
| Condenser **28** and homologues, each | $\mu\mu$f | 2.06 |
| Inductances **32, 34, 40, 42, 54, 56** each | $\mu$h | 0.18 |
| Inductances **64** and **66**, each | $\mu$h | 0.34 |
| Resistances **72** and **78**, each | ohms | 680 |

For the above type transistors in a common emitter configuration, the frequency is 250 mc. when the current gain is one. Therefore, the reciprocal of the corresponding angular frequency, and consequently the emitter RC time constant, is approximately $635\times10^{-12}$. To determine the value of the external emitter resistance R, the following formula may be used:

$$R=\frac{r_1FNf_2}{2kf_1}-r_2$$

where:

$r_1$ is the base spreading resistance (known for the above transistors as 50 ohms);

F is the Miller capacity effect factor (2.0 determined by experience for constant-K amplifiers);

N is the number of sections (5);

$f_2$ is the desired bandwith (assume 250 mc.);

$f_1$ is the frequency when current gain=1;

$k$ is a factor (0.8) determined by experience for flat response; and $r_2$ is the emitter diffusion resistance (known: 5.4 ohms).

Substituting, it will be found that R is 307 ohms, which when divided into the time constant makes the external emitter capacitance equal to 2.06 $\mu\mu$f, all as above set forth. Limitation to any of the foregoing values is not intended, however, since such may vary in different situations because of variations in lead inductances, in wiring capacitances in transistors, etc., and in any event tolerances generally may be ±10%. Of course, series inductances without intervening connections may be lumped, e.g. inductances 34 and 40 may be a single inductor, as can be inductance 66 of section one and inductance 64 of section two.

As an improvement over the constant-K distributed amplifier above described, I have discovered that transistors with respective parallel RC emitter circuits whose time constants are as aforesaid, may be employed with input and output transmission lines which exhibit a constant resistance characteristic, regardless of frequency, rather than a constant complex impedance as in the constant-K type. In the amplifier of Figure 1 there is an inherent spreading resistance in the input circuit of each of the transistors due mainly to base connection resistance as above indicated, and it is presumed that with a constant-K input transmission line, such resistances are not desirable elements of what otherwise is a lossless transmission line. In Figure 1, the effect from these resistances is partially compensated for by the gain function of each amplifying section caused by the emitter degeneration due to the emitter RC circuit. It has been found better to recognize the existence of these resistances and make them an integral part of the input transmission line. Distributed amplifiers with constant resistance input transmission lines, and also constant resistance output transmission lines are shown in Figures 2 and 3, the difference between these figures being a difference in the type of output or collector filter sections.

Figure 2:
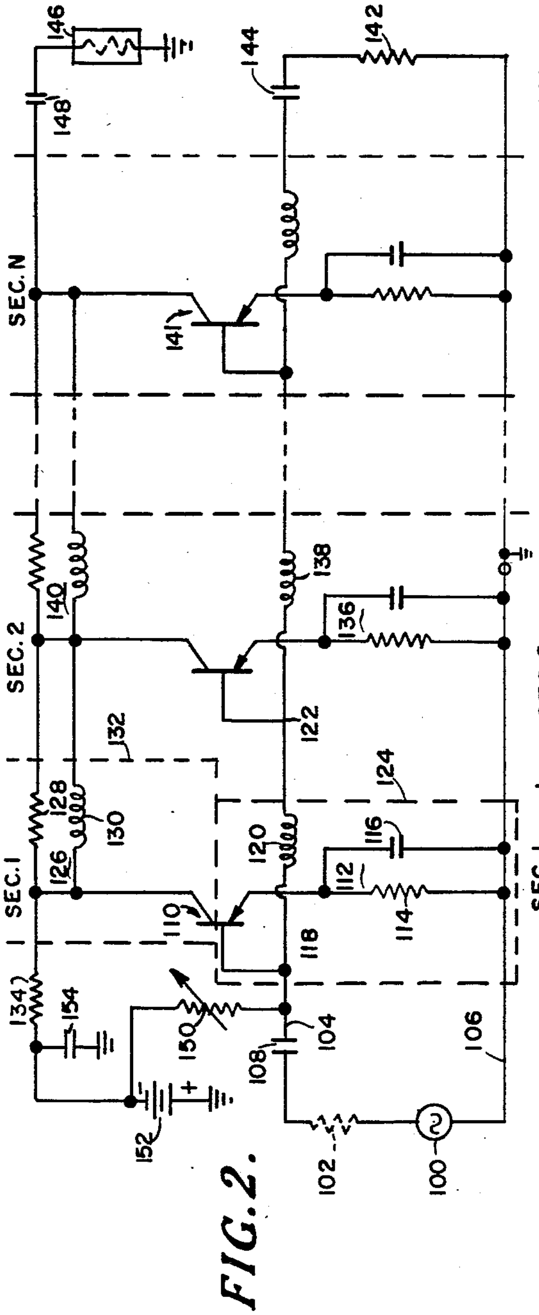
Figure 2 is a schematic drawing of a transistorized distributed amplifier with input and output transmission lines of constant resistance.
Figure 3:
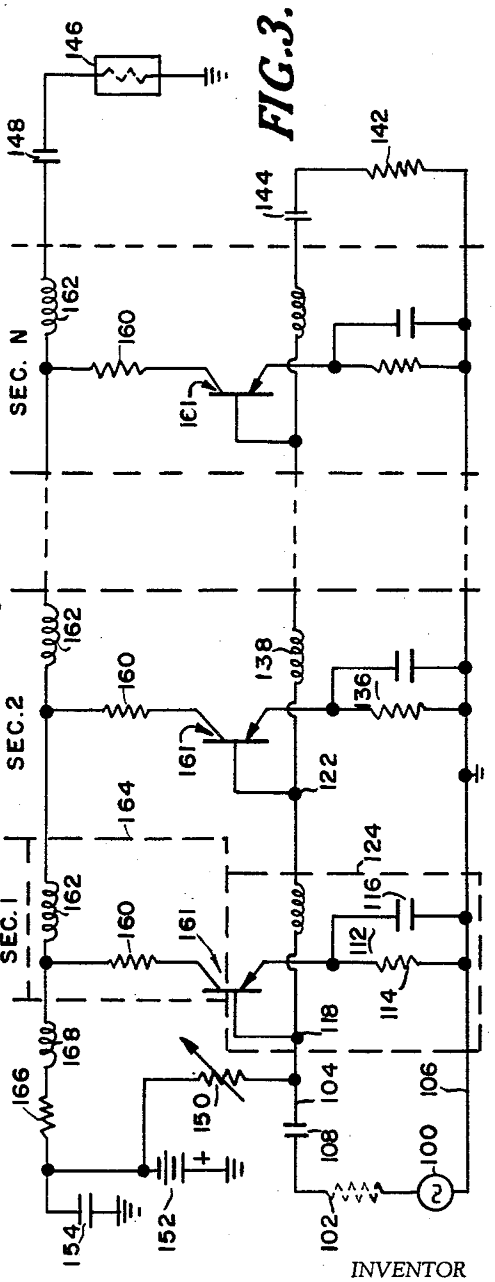
Figure 3 is a modification of the distributed amplifier of Figure 2, the output transmission line being different.

In Figure 2, the input signal source 100 with its internal impedance 102 is coupled to the base or input transmission line including conductors 104 and the grounded conductor 106, by condenser 108. The first stage or section of the amplifier includes transistor 110, and as in Figure 1, the emitter electrode is connected to the grounded line 106 by a parallel RC circuit 112 including resistor 114 and condenser 116 which have values forming a time constant that is the reciprocal of the angular frequency of the transistor when the current gain thereof in a common emitter configuration is substantially one. The base line 104 is connected at junction 118 directly to the base of transistor 110. Junction 118 also connects one end of inductance 120, the other end of which goes to the input junction 122 in the second section.

The impedances within the rectangle formed by dash line 124, including the internal input impedance of transistor 110, form a filter section which has an input and output characteristic impedance that is a constant resistance regardless of frequency. Because of this, there need be no impedance matching section between resistance 102 and the input resistance of section 124.

The collector of resistor 110 is coupled to the parallel RL circuit 126 comprising resistor 128 and inductance 130. The impedances in the rectangle formed by dash line 132, including the output capacitance of transistor 110, form a filter section for the collector or output transmission line, and this filter, like filter 124 in the base transmission line, has a characteristic input-output impedance which is a constant resistance regardless of frequency. The collector transmission line may, therefore, be terminated by resistor 134 without the need of any matching filter section between resistor 134 and the input impedance of the first stage output line filter section 132.

The second stage or section of the amplifier of Figure 2 is exactly like the first stage, and includes in the base or input transmission line an inductance 138 and the emitter parallel RC circuit 136. In the collector or output transmission line section is a parallel RL circuit 140 similar to the RL circuit 126 described for section one. Since the input and output resistances of each section of the input transmission line are equal, as are the input and output resistances of each section of the output transmission line, no impedance matching between sections is necessary. As in Figure 1, any number of sections may be employed, but in Figure 2 the output of the Nth section is not the same as each prior output section thereof because it has been discovered that no resistance or inductance need be coupled to the collector of transistor 141. The collector of transistor 141 forms the output of the output transmission line and is directly coupled to a terminating load 146 through a blocking condenser 148. Since the output impedance of the collector line section N is resistive, the impedance of load 146 is resistive and there need be no intervening matching section.

The base or input transmission line is terminated by resistor 142 coupled to the line by blocking condenser 144. The value of resistor 142 is the same as that of resistor 102 and of the characteristic impedance of each of the intervening filter sections of the base transmission line.

Resistor 150 as connected to the negative side of battery 152 supplies the desired base current for all of the transistors, while connection of the battery to resistor 134 supplies the necessary collector-emitter voltage and current. Condenser 154 may be employed for bypass purposes.

In effect, each of the filter sections in both the input and output transmission lines of the amplifier in Figure 2, provide low pass frequency characteristics. Without limitation intended the following component values may be employed with Philco 2N502 transistors in a seven section distributed amplifier to give an over-all 3 db bandwidth of 150 mc., a power gain of about 10 db, and a saturated power output of 100 milliwatts:

| | | |
|---|---|---|
| Resistors 102 and 142, each | ohms | 50 |
| Emitter resistor 114 and homologues, each | do | 109 |
| Emitter condenser 116 and homologues, each | $\mu\mu$f | 5.8 |
| Inductance 120 and homologues, each | $\mu$h | 0.17 |
| Resistor 128 and homologues, each | ohms | 225 |
| Inductance 130 and homologues, each | $\mu$h | .075 |
| Resistor 134 and load resistance, each | ohms | 225 |

To calculate initially the value which the external emitter resistances should have in Figure 2 (and Figure 3), use may be made of the following formula wherein the letters have the same meaning as for the formula above stated:

$$R=\frac{1.2(N)^{1/2}f_2r_1F}{f_1}-r_2$$

By experience it has been determined that the Miller factor F for constant resistance amplifying sections should be 2.0. Assuming the desired bandwidth $f_2$ is 150 mc. and that seven of the above mentioned transistors are used, R is found to be 109 ohms which when divided into the time contant of $635\times10^{-12}$, gives an external emitter capacitance of 5.8 $\mu\mu$f., as stated in the above table. Again any of the values in the table may vary considerably within the concept of this invention, due to the various factors as above mentioned with regard to Figure 1.

A third embodiment of this invention is illustrated in Figure 3. In this embodiment the input or base transmission line is exactly like that illustrated in Figure 2 and corresponding parts are consequently given corresponding numbers. The collector or output transmission line, however, is different in that instead of using a parallel RL circuit in each output filter section there is employed in Figure 3 an L-type filter which has a resistance 160 connected in series with the collector electrode of the respective transistor 161 with the upper end of the resistor 160 being connected to an arm inductance 162. The impedances within the rectangle formed by dash line 164, including the output capacitance of the transistor, form a constant resistance input and output impedance characteristic for the filter section. Since each successive filter section has the same input and output characteristic impedance, they may feed one into the other without any intervening matching being necessary. Likewise, there is no matching necessary between the filter section 164 and terminating resistance 166, but inductance 168 is employed therebetween so that the collector of the first stage transistor may see the same driving impedance in both directions as does each of the other transistor collectors. It may be noted that for the Nth section of the amplifier in Figure 3, there is an output inductance 162 which is employed for reasons similar to those just stated for inductance 168 in conjunction with the purpose of fulfilling the Nth filter section requirements, whereas in Figure 2 the Nth section needs no resistance or inductance between the collector and the terminating load.

Because of the inductance 162 in the Nth stage of Figure 3 and the inductance 168, there is a decrease in bandwidth for a given over-all gain of the distributed amplifier of Figure 3 than with the amplifier of Figure 2. Therefore, for a given over-all gain, the circuit of Figure 2 will give a greater gain-bandwidth product than will the circuit of Figure 3. Either of the amplifiers of Figures 2 or 3 are fairly insensitive to voltage, temperature, and transistor variations, and in this respect are superior to the constant-K amplifier of Figure 1.

In all three embodiments, PNP transistors are illustrated, but of course NPN transistors could be employed. Preferably, though not necessarily, the transistors are of the diffused base type. The significant advantages of my transistorized distributed amplifiers over the conventional vacuum tube types are in smaller size, weight, and power requirements, better reliability, more durable, and longer life, as well as others which transistor circuits in general offer over vacuum tube circuits.

Thus it is apparent that there is provided by this invention systems in which the various objects and advantages herein set forth are successfully achieved.

Modifications of this invention not described herein will become apparent to those of ordinary skill in the art after reading this disclosure. Therefore, it is intended that the matter contained in the foregoing description and the accompanying drawings be interpreted as illustrative and not limitative, the scope of the invention being defined in the appended claims.

What is claimed is:

1. A wideband distributed amplifier comprising an input transmission line having N sections, N transistors each having base, collector, and emitter electrodes, N parallel RC circuits respectively connected to said emitter electrodes, each transistor and its RC circuit being coupled across a different one of said N sections in a common emitter configuration, the time constant of each RC circuit being substantially equal to the reciprocal of the angular frequency of the respective transistor when the current gain of that transistor is equal to one while in a common emitter configuration, said transmission line being terminated in its characteristic impedance, and an output transmission line having N sections coupled respectively to said collector electrodes and being terminated, at the end thereof remote from the termination of the input line, in its characteristic impedance.

2. A distributed amplifier as in claim 1 wherein each section of each of said input and output transmission lines, when respectively considered with the input and output impedances of their respective transistors, is a constant-K T-section, and wherein each of said transmission lines has before the first section and after the Nth section a series *m*-derived half section filter for termination impedance matching purposes.

3. A distributed amplifier as in claim 1 wherein the input transmission line includes N inductances one connected between each base electrode and one connected between the base electrode of the Nth transistor and the input line termination impedance, the inductance between any two base electrodes being part of the transmission line section associated with the transistor having the base electrode first in line as between said two transistors, the arrangement being such that as to the effective internal input impedances of each transistor the inductance and associated RC circuit form a constant resistance filter section with each such filter section having the same characteristic input and output impedance.

4. A distributed amplifier as in claim 3 wherein the output transmission line includes $N-1$ parallel resistance and inductance combinations coupled respectively between successive collector electrodes for forming in conjunction with the internal output impedance of the transistors a constant resistance output transmission line.

5. A distributed amplifier as in claim 3 wherein each section of the output transmission line includes a resistance connected at one end to the respective collector electrode and at another end to an inductance, the junction between the resistance and inductance being between the inductance and the said characteristic terminating impedance of the output transmission line, the output transmission line further including a second inductance serially coupled between the characteristic termination impedance of the output line and the junction between the resistance and inductance of the first in line section of the output transmission line, and a third inductance serially coupled as an output to the inductance of the Nth section of the output transmission line, the arrangement being such that the impedance of the resistance and inductance of each output line section when taken in conjunction with the effective internal output impedance of the respective transistor is a filter section whose characteristic input and output impedance is a constant resistance.

6. A distributed amplifier as in claim 1 wherein each transistor is of the PNP type.

7. A distributed amplifier as in claim 1 wherein each of the transistors is of the diffused base type.

8. In a wideband amplifier having an input and an output, at least one transistor having base, collector and emitter electrodes, a parallel RC circuit serially connected to the emitter electrode of said transistor, means coupling the series combination of the transistor and RC circuit across said input in a common emitter configuration, the time constant of the RC circuit being substantially equal to the reciprocal of the angular frequency of the transistor when the current gain of that transistor is equal to one while in a common emitter configuration, and means coupling the collector electrode to said output.

No references cited.